March 10, 1964 P. D. BELLAMY ETAL 3,124,758
TRANSISTOR SWITCHING CIRCUIT RESPONSIVE IN PUSH-PULL
MANNER TO SINGLE-ENDED INPUT
Filed Sept. 8, 1960

INVENTORS
PAUL D. BELLAMY
GEORGE MUELLER
BY Arthur S. Tenser
ATTORNEY

United States Patent Office 3,124,758

Patented Mar. 10, 1964

3,124,758

TRANSISTOR SWITCHING CIRCUIT RESPONSIVE IN PUSH-PULL MANNER TO SINGLE-ENDED INPUT

Paul D. Bellamy and George Mueller, Poughkeepsie, N.Y., assignors to International Business Machines Corporation, New York, N.Y., a corporation of New York Filed Sept. 8, 1960, Ser. No. 54,719
6 Claims. (Cl. 330—18)

This invention relates to amplifiers and more particularly to amplifiers of the push-pull type utilizing transistors as the principal components thereof.

In applications where high amplification of an input signal is required, the push-pull configuration has gained considerable favor. The reciprocal nature of such circuits reduces harmonic generation and provides larger amounts of usable power than are available from conventional single-ended output stages. The push-pull stage has the disadvantage, however, that a push-pull input is normally required to provide the input signal. This necessitates more complicated driver circuitry, which may offset the advantages gained by the push-pull configuration. This is particularly true with vacuum tube circuitry.

With the advent of transistor elements having complementary conductivity types, it is possible to provide push-pull amplifiers having little or no added driver circuity. Since the transistors used in such a configuration are of opposite conductivity types, a single phase input signal coupled concurrently to the inputs of both of the transistors automatically turns one of the transistors on while the other is being turned off, and vice versa. Thus, in many applications, little or no circuitry is required between the signal source and the inputs of the amplifier transistors.

While this complementary transistor push-pull amplifier provides a great many advantages over the earlier types, it is found to have a serious drawback where large amounts of output power are required. This is occasioned by the fact that while high power transistors of the PNP type are readily available, NPN counterparts are not. Circuit symmetry, therefore, cannot be obtained and the simplicity of the complementary transistor approach cannot be utilized where high output powers are required. Moreover, from the standpoints of standardization and economy, the use of two types of transistors is undesirable in certain applications. Push-pull amplifiers utilizing one type of transistor only were developed to provide the requisite output power, but heretofore, complex circuitry was required to provide the push-pull input necessary to drive such a configuration.

Accordingly, the present invention has for its primary object the provision of an improved push-pull amplifier utilizing transistors of the same conductivity type.

A further object of this invention is to provide a push-pull amplifier driven by a single ended input with a minimum of input circuitry.

Still another object of this invention is to provide a push-pull amplifier providing large amounts of output power.

The basic circuitry of the present invention comprises a grounded emitter stage coupled to the emitter of a common collector stage. An input signal is applied to the base of the transistor of the common emitter stage while the load is coupled to the emitter of the common collector transistor. Between the collector of the common emitter stage and the base of the common collector stage is provided a device across which appears a voltage drop which remains relatively constant over a large range of values of current flow therethrough. In addition, an impedance means is provided in series between the collector of the common emitter stage and the emitter of the common collector stage. This impedance, and the voltage drop across the aforementioned constant voltage element, are so proportioned that when the common emitter stage is conducting, providing current to the load, the common collector stage is held cut off. When the input to the common emitter stage turns that stage off, the voltage relations at the common collector stage are changed and the latter stage becomes conducting, providing current flow through the load in the opposite direction. The constant voltage element can be provided simply by a semiconductor device, such as a silicon junction diode, and thus push-pull operation may be achieved without any conversion of the input signal and with the use of readily available, inexpensive components.

The foregoing and other objects, features and advantages of the invention will be apparent from the following more particular description of a preferred embodiment of the invention as illustrated in the accompanying drawings.

Figure 1:
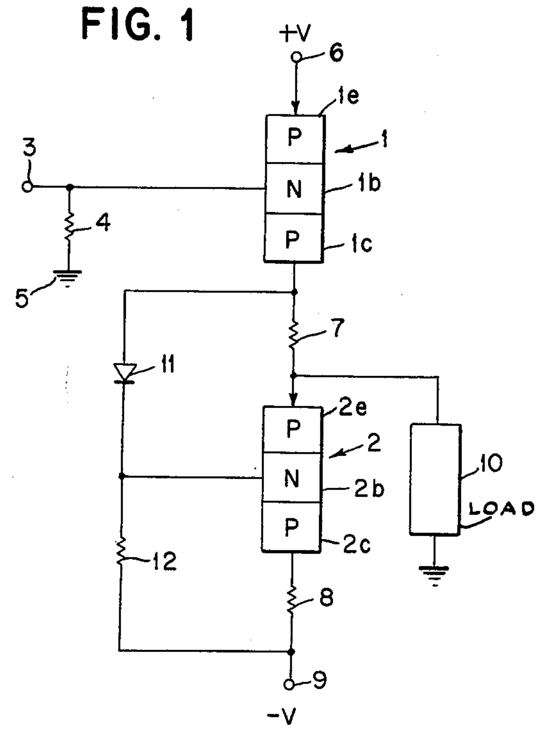
FIG. 1 is a circuit diagram of a preferred embodiment of the invention.

Referring now to FIG. 1, there is shown a preferred form of a circuit of the invention. As illustrated, it comprises a transistor 1 of the PNP type having an emitter 1*e*, a base 1*b*, and collector 1*c*. There is also provided a second transistor 2 of the PNP type having an emitter 2*e*, a base 2*b*, and collector 2*c*. The base 1*b* of transistor 1 is coupled through resistor 4 to ground or reference potential 5. Also coupled to base 1*b* is terminal 3 to which input signals are applied. Emitter 1*e* coupled to positive voltage source 6.

The collector 1*c* of transistor 1 is coupled through resistor 7 to the emitter 2*e* of transistor 2. The collector 2*c* is coupled through resistor 8 to a source of negative potential 9. The load 10, which may be of any type, is coupled between the emitter 2*e* and reference potential. To the collector 1*c* there is also coupled a device 11, shown as a diode, the other terminal of which is connected to the base 2*b* of transistor 2. A resistor 12 is coupled between the base 2*b* and collector 2*c* of the transistor 2.

As shown, the unidirectional conducting device 11 has its positive or anode terminal connected to the collector 1*c* and its negative or cathode terminal connected to the base 2*b*. The device 11 is selected to have an impedance in its forward conducting direction greater than the forward impedance of the emitter-base junction of the transistor 2. Thus, for example, diode 11 may be made of silicon and transistor 2 of germanium to provide the requisite impedance characteristics; or device 11 may be physically composed of a series of individual diodes, the total forward impedance of which is greater than that of the emitter-base junction of the transistor, regardless of its material.

Figure 2:
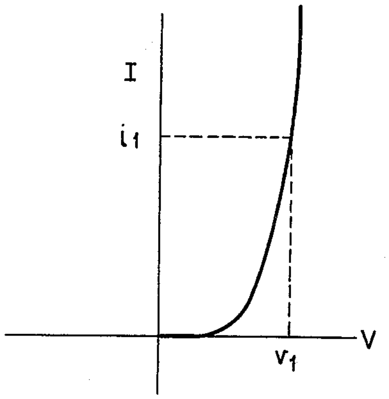
FIG. 2 illustrates the forward conduction characteristic of a diode such as is usable in the present invention.
Figure 3:
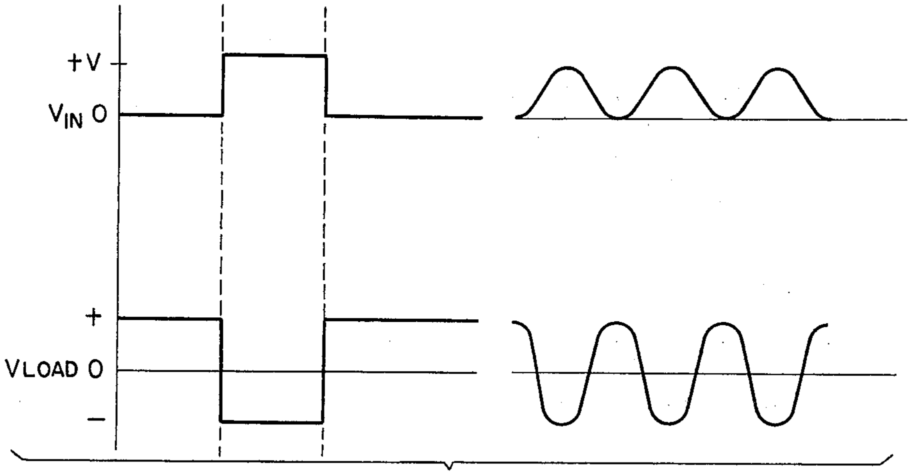
FIG. 3 is a series of waveforms useful in explaining the operation of the circuit of FIG. 1.

Operation of the circuit may be more easily understood when considered in conjunction with the waveforms of FIG. 3. For illustration purposes, a rectangular wave input signal will initially be presumed in the ensuing explanation. As shown therein, the input voltage applied to terminal 3 varies between reference potential and some positive voltage larger than the positive voltage applied at terminal 6. When the input voltage is at its more negative level, (at reference potential) the emitter-base junction of transistor 1 is forward biased and base current is supplied to the device through resistor 4. Transistor 1 is driven to saturation, providing a large current flow out of its collector. Part of this current flows through resistor 7 and into the load impedance 10. Another portion of this current flows through the device 11 and resistor 12. The forward conduction characteristic of a semiconductor diode, such as would be used as device 11, is shown in FIG. 2. As can be seen, the voltage across such a device is substantially independent of the current flow therethrough once the device is operating beyond the knee of its curve.

In the ON condition of transistor 1, the current $i_1$ through diode 11 is sufficient to render the device operative beyond the knee of its curve and a potential $v_1$ appears thereacross. Since the characteristic is substantially vertical in this region, fluctuations in $i_1$, such as may be occasioned by variations in the load impedance 10, do not appreciably change the voltage drop across the diode. In the ON condition of the transistor 1 therefore, this relatively constant voltage appears across the device 11, while at the same time a large current is flowing through the resistor 7. This latter element is chosen to be of a value such that its voltage drop with the transistor 1 fully conductive will be greater than that appearing across diode 11. In this condition, it is apparent that the emitter 2e of transistor 2 will be more negative than the base 2b, rendering the transistor 2 nonconductive. As long as this condition remains, i.e., transistor 1 conductive and transistor 2 cut off, current is being supplied from the collector of transistor 1 to the load 10 and the voltage across the load will be positive with respect to ground, as shown in FIG. 3.

As the input voltage rises from ground to its more positive level, the transistor 1 becomes less and less conductive, until at the point when the input voltage reaches some value greater than the positive voltage at terminal 6, the transistor 1 is completely cut off. Current now tends to flow from reference potential and through load impedance 10 towards negative voltage source 9. At the emitter 2e of transistor 2, this current divides into two branches. One of these circuit paths comprises resistor 7 and diode 11; the other is provided by the emitter-base diode of the transistor 2. It will be appreciated that non-conductive transistor 1 will appear effectively as an open circuit to this current flow and all of the current will divide as above described.

As noted hereinabove, the device 11 is selected to have an impedance greater than that of the emitter-base junction of transistor 2. It will be obvious then, that a larger portion of the current will flow through transistor emitter-base junction than through the series impedance of resistor 7 and diode 11. This current flow out of the base of transistor 2 drives the transistor 2 into saturation. Accordingly, a large current is drawn through the load 10 by the transistor 2 which is in a direction opposite to that resulting from conduction of transistor 1. The voltage drop therefore appearing across the load 10 is reversed from that in the other condition of operation.

When the input signal drops to its negative level again, the situation reverses itself and transistor 1 becomes fully conductive (i.e. saturated) to cut off transistor 2. As can be seen from FIG. 3, the output is an amplified and inverted replica of the input signal. Resistance 8 is preferably made equal in value to resistance 7 and the voltage sources 6 and 9 equal in magnitude (but opposite in polarity). This provides an output voltage across the load 10 which is symmetrical with respect to reference or ground potential when similar transistors are used. It is obvious, of course, that the absolute voltage levels may be varied if desired, by selection of different values of resistances 7, 8, voltage sources 6, 9 and by returning the load to a different voltage level.

When used with rectangular wave input signals, the above described circuit enables large currents to be rapidly switched in both directions through a load. This property of the circuit makes it extremely attractive for operating electromagnetic elements, such as relays, wherein it is desirable to both turn on and turn off rapidly. When used for such purposes, it is advantageous to operate the transistors 1 and 2 between saturation and cut-off conditions, as described above.

It is apparent, however, that the circuit will operate in true push-pull fashion with any type of input wave form applied thereto. Thus, in FIG. 3 the relative input and output of voltages for a sine wave signal have been illustrated. When amplifying this type of signal, it is necessary only that the maximum positive amplitude of the input be somewhat less than the positive voltage at the emitter 1e so that the transistor 1 is never completely cut off, and that it never goes quite to zero or reference potential so that the transistor 1 never quite reaches saturation.

It will also be readily apparent from consideration of the circuit, that if desired, NPN transistors may be used as well as the PNP type shown. This conversion may be obtained merely by reversing the polarities of the voltage sources and the diode 11.

While the invention has been particularly shown and described with reference to a preferred embodiment thereof, it will be understood by those skilled in the art that various changes in form and details may be made therein without departing from the spirit and scope of the invention.

What is claimed is:

1. An amplifier of the push-pull operating type comprising, a pair of transistors of like conductivity type and having biasing means for rendering said transistors operable, each transistor having an emitter, a base, and a collector, means connecting the collector of one of said transistors to the emitter of the other, output means coupled to the common connection of said two transistors, means for applying an input signal only to the base of said one transistor, and unidirectional conducting means providing a substantially constant voltage drop coupled between the collector of said one transistor and the base of the other of said transistors.

2. A single-ended input amplifier of the push-pull operating type comprising, a pair of transistors of like conductivity type and having biasing means for rendering said transistors operable, each transistor having an emitter, a base, and a collector, impedance means connecting the collector of one of said transistors to the emitter of the other, output means coupled to the common connection of said two transistors, means for applying an input signal only to the base of said one transistor, and unidirectional conducting means connected between the collector of said one transistor and the base of the other of said transistors.

3. An amplifier of the push-pull operating type comprising, first and second transistors having biasing means for rendering said transistors operable, each transistor having an emitter, a base, and a collector, impedance means coupling the collector of said first transistor to the emitter of said second transistor, means for applying an input signal only to said first transistor, a load impedance coupled to the emitter of said second transistor, and a unidirectional conducting device coupling the collector of said first transistor to the base of said second transistor.

4. The amplifier of claim 3 above wherein said unidirectional conducting device comprises a semiconductor junction diode.

5. A single-ended input amplifier of the push-pull operating type, comprising first and second transistors of the same conductivity type and having biasing means for rendering said transistors operable, each transistor having an emitter, a base and a collector, means for applying an input signal to the base of said first transistors to vary the conductivity thereof, load impedance means coupled to the emitter of said second transistor, and circuit means coupling the collector of said first transistor whereby an amplified inverted replica of said input signal appears across said load impedance means, said circuit means comprising a resistor impedance coupled between the collector of said first transistor and the emitter of said second transistor, and means including a device providing an impedance greater than the impedance of the emitter-base junction of said second transistor and having a voltage drop which remains relatively constant over a large range of values of current flow therethrough coupled between the collector of said first transistor and the base of said second transistor.

6. The amplifier of claim 5 above wherein said last-named means comprises a semiconductor diode.

References Cited in the file of this patent

UNITED STATES PATENTS

| | | |
|---|---|---|
| 2,358,428 | White | Sept. 19, 1944 |
| 2,658,117 | Sunstein et al. | Nov. 3, 1953 |
| 2,744,169 | Deming | May 1, 1956 |
| 2,929,997 | Cluwen | Mar. 22, 1960 |
| 2,943,266 | Belland | June 28, 1960 |
| 2,981,895 | Koch | Apr. 25, 1961 |

FOREIGN PATENTS

| | | |
|---|---|---|
| 859,045 | Great Britain | Jan. 18, 1961 |